United States Patent

Kobashi et al.

Patent Number: 5,352,908
Date of Patent: Oct. 4, 1994

[54] DIAMOND SCHOTTKY DIODE WITH OXYGEN

[75] Inventors: Koji Kobashi; Koichi Miyata; Kozo Nishimura, all of Kobe, Japan

[73] Assignee: Kabushiki Kaisha Kobe Seiko Sho, Kobe, Japan

[21] Appl. No.: 145,307

[22] Filed: Nov. 3, 1993

Related U.S. Application Data

[63] Continuation of Ser. No. 858,494, Mar. 27, 1992, abandoned.

[30] Foreign Application Priority Data

Mar. 29, 1991 [JP] Japan ................. 3-066482

[51] Int. Cl.⁵ .............................. H01L 29/48
[52] U.S. Cl. .............................. 257/73; 257/76; 257/77; 257/485
[58] Field of Search ........... 257/77, 485, 73, 76; 437/173, 175, 187

[56] References Cited

U.S. PATENT DOCUMENTS

| | | | |
|---|---|---|---|
| 4,982,243 | 1/1991 | Nakahata et al. | 357/15 |
| 5,002,899 | 3/1991 | Geis et al. | 257/77 X |
| 5,072,264 | 12/1991 | Jones | 257/77 X |
| 5,086,014 | 2/1992 | Miyata et al. | 437/103 |
| 5,107,315 | 4/1992 | Kumagai et al. | 257/77 X |
| 5,132,749 | 7/1992 | Nishibayashi et al. | 257/77 |

FOREIGN PATENT DOCUMENTS

| | | |
|---|---|---|
| 0445998 | 9/1991 | European Pat. Off. |
| 4202154 | 8/1992 | Fed. Rep. of Germany |
| 63-220525 | 9/1988 | Japan |
| 1239091 | 9/1989 | Japan |
| 2236902 | 4/1991 | United Kingdom |
| 2252202 | 7/1992 | United Kingdom |

*Primary Examiner*—William Mintel
*Attorney, Agent, or Firm*—Oblon, Spivak, McClelland, Maier & Neustadt

[57] ABSTRACT

A diamond Schottky diode including an electrically conductive substrate, a multi-layer structure of a semiconducting diamond layer and an insulating diamond layer, and a metal electrode. This diode has a greater potential barrier under a reversed bias and hence exhibits better rectifying characteristics with a smaller reverse current.

5 Claims, 4 Drawing Sheets

ZERO BIAS

REVERSED BIAS
$V > 0$

FORWARD BIAS
$V < 0$

DIAMOND SCHOTTKY DIODE WITH OXYGEN

This application is a continuation of application Ser. No. 07/858,494, filed on Mar. 27, 1992, now abandoned.

BACKGROUND OF THE INVENTION

1. Field of the Invention

The present invention relates to a diamond Schottky diode to be used for a rectifying device.

2. Description of the Prior Art

Diamond has a high thermal conductivity, an excellent stability against heat, and a large band gap. It is electrically insulating but becomes semiconducting upon doping. By the advent of the synthesis of diamond films by chemical vapor deposition (CVD), it has now become possible to grow B (boron)-doped p-type semiconducting diamond films and Si-doped n-type semiconducting diamond films.

Research and development efforts have been made to develop semiconductor devices employing such semiconducting diamond films, for example, a diamond Schottky diode used for a rectifying device which can be operated in a high electric power/high temperature region. A diamond Schottky diode is composed of a semiconducting diamond layer and a metal electrode. It has a higher Schottky barrier of 1.1 eV than the conventional one (0.8 eV) composed of a semiconducting silicon layer and a metal electrode made of aluminum or the like. Consequently, in the diamond Schottky diode, the reverse current due to thermionic emission is small under a reversed bias.

A diamond Schottky diode having such a cross-sectional structure as shown in FIG. 7 is disclosed in the literature (G. Sh. Gildenblat et al., Technical Digest of 1988 Int. Electron Device Meeting). It consists of a low-resistance silicon substrate 51 (resistivity: less than 1 Ω·cm), a B-doped p-type semiconducting diamond layer 52, and a metal electrode 53 made of Au or Al.

The diamond Schottky diode is fabricated in the following procedure. A silicon substrate 51 is cut in adequate size and is then polished for about 30 minutes by diamond paste having an average particle diameter of about 1 μm. A B-doped p-type semiconducting diamond layer 52 is formed on the silicon substrate 51 by microwave CVD. As a reaction gas, there is used a source gas of $CH_4$—$H_2$ mixture ($CH_4$ concentration: 0.5%) added with a doping gas of diborane $B_2H_6$ diluted by $H_2$. It takes about 7 hours to form the p-type semiconducting diamond layer 52 of about 2 μm thick.

The conventional diamond Schottky diode fabricated as mentioned above is disadvantageous in that the reverse current is mainly due to recombination current and is greater than that due to thermionic emission. Thus it needs improvement in the reduction of reverse current.

SUMMARY OF THE INVENTION

It is an object of the present invention to provide a diamond Schottky diode excellent in rectifying performance with a small reverse current.

To achieve the foregoing object the present invention provides a diamond Schottky diode comprising an electrically conductive substrate, a multi-layer structure of a semiconducting diamond layer and an insulating diamond layer, and a metal electrode.

BRIEF DESCRIPTION OF THE DRAWINGS

The above and other objects, features and advantages of the present invention will be more apparent from the following description taken in connection with the accompanying drawings, in which.

DESCRIPTION OF THE PREFERRED EMBODIMENTS

Prior to the description of the preferred embodiments, the function of the diamond Schottky diode of the present invention will be explained.

The diamond Schottky diode of the present invention has the foregoing structure, and consequently a potential barrier under a reversed bias is increased thereby extremely reducing a reverse current. This is now explained below with reference to a diode having a p-type semiconducting diamond layer.

Figure 2A:
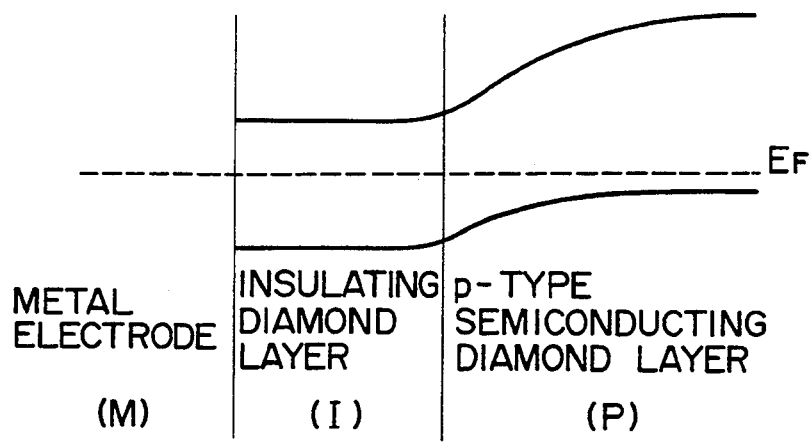
FIGS. 2(a) to 2(c) are energy band diagrams for a diamond Schottky diode of the present invention.
Figure 2B:
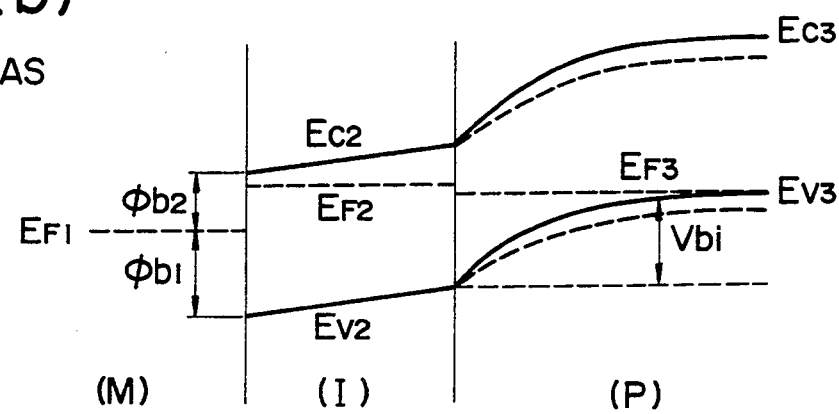
Figure 2C:
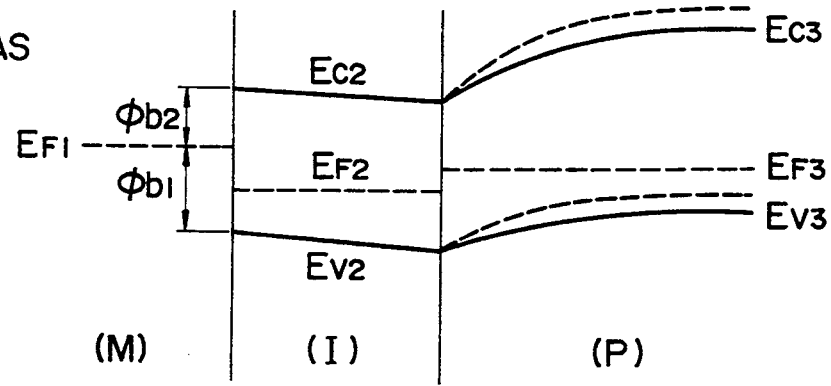

FIG. 2 is an energy band of the diamond Schottky diode of the present invention, wherein a flat band is assumed at the interface between an insulating diamond layer I and a metal electrode M. In this figure, (a) shows an energy band structure under zero bias (Dias voltage V=0), (b) is under a reversed bias (V>0) where a positive voltage is applied to the metal electrode M, and (c) is under a forward bias (V<0) where a negative voltage is applied to the metal electrode M. Furthermore, $E_{F1}$, $E_{F2}$, and $E_{F3}$ shows Fermi levels in the metal electrode M, the insulating diamond layer I, and a p-type semiconducting diamond layer P, respectively; $E_{C2}$ and $E_{C3}$ are the energies at the lowest edges of the conduction bands, and also $E_{V2}$ and $E_{V3}$ are the energies at the highest edges of the valence bands, respectively, in the insulating diamond layer I and the p-type semiconducting diamond layer P; $\phi_{b1}$ and $\phi_{b2}$ are the potential barriers at the interface between the metal electrode M and insulating diamond layer I, respectively; and $V_{bi}$ is the built-in potential of the p-type semiconducting diamond P.

Under a reversed bias where the metal electrode M is positive as shown in FIG. 2 (b), since the resistance of the insulating diamond layer I is larger than that of the p-type semiconducting diamond layer P, the Fermi levels are in order of $E_{F1}<E_{F3}<E_{F2}$, and the p-type semiconducting diamond layer P has an energy band greatly bent due to the electric field applied thereon.

Therefore, the interface between the p-type semiconducting diamond layer P and the insulating diamond layer I has a high potential barrier which prevents holes from transporting from the metal electrode M to the p-type semiconducting diamond layer P. In addition, the insulating diamond layer I has a uniform electric field, thereby decelerating the holes which have entered it.

Under a forward bias where the metal electrode M is negative as shown in FIG. 2 (c), the apparent built-in potential of the p-type semiconducting diamond layer P is decreased and the holes which have entered the insulating diamond layer I are accelerated by the electric field. Consequently, holes are liable to be transported toward the metal electrode. Meanwhile, electrons are less liable to be transported because of the potential barrier $\phi_{b2}$ at the interface between the metal electrode M and the insulating diamond layer I.

EXAMPLES

The present invention will be described in detail with reference to the following examples.

Example 1

Figure 1:
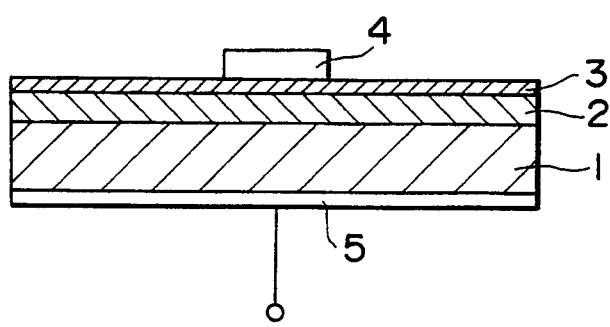
FIG. 1 is a schematic cross-sectional view showing a diamond Schottky diode according to an embodiment of the present invention.
Figure 7:
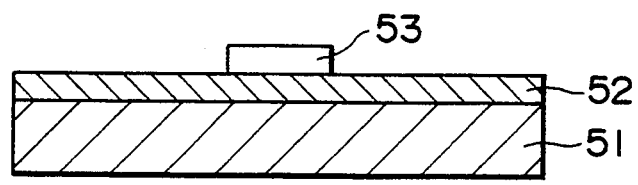
FIG. 7 is a schematic cross-sectional view showing a conventional diamond Schottky diode.

A diamond Schottky diode, as shown in FIG. 1, was fabricated in the following procedure:

(1) A low-resistance silicon substrate 1 (resistivity: less than 1 Ω·cm, size: 20 mm × 10 mm) was polished for about 1 hour by diamond paste having an average particle diameter of 0.25 μm). A B-doped polycrystalline p-type semiconducting diamond layer 2 of 1.5 to 3 μm was formed on the silicon substrate 1 by microwave plasma CVD. As a reaction gas, there was used a source gas of a $CH_4$—$H_2$ mixture ($CH_4$ concentration: 0.5%) added with a doping gas of diborane ($B_2H_6$) (diluted with $H_2$) in a concentration of 0.1 ppm to the whole gas flow rate of for 100 sccm. The reaction time used was 7 to 14 hours.

(2) An insulating diamond layer 3 was formed on the p-type semiconducting diamond layer 2 by microwave plasma CVD. As a reaction gas, there was used a source gas of a $CH_4$—$H_2$ mixture ($CH_4$ concentration: 0.5%) added with oxygen in a concentration of 0.1% to the whole gas flow rate of 100 sccm. It takes 30 min. and 60 min. to form the insulating diamond layer 3 of about 0.05 μm and 0.1 μm thick, respectively. An Al electrode 4 having a diameter of 100 μm was formed on the insulating diamond layer 3 with use of a magnetron sputtering apparatus. For comparison, the same procedure as mentioned above was repeated, except that the insulating diamond layer 3 was not formed and the Al electrode was formed on the p-type semiconducting diamond layer 2.

(3) Then, the silicon substrate 1 was cut to obtain individual chips of 5 mm × 5 mm using a dicing saw. Each chip was heated in sulfuric acid at 80° C. for about 5 min. to remove organic residues and washed with pure water. Subsequently, the chip was subjected to RCA cleaning with $H_2O_2$+$NH_3OH$+$H_2O$ and $H_2O_2$+HCl+$H_2O$ for 5 min. each, to remove heavy metal and alkali residues. Finally, the chip was washed with pure water and dried in an oven at 120° C. for 5 min.

(4) An ohmic electrode 5 made of copper plate was bonded to the back side of the silicon substrate 1 by a silver paste.

Figure 3:
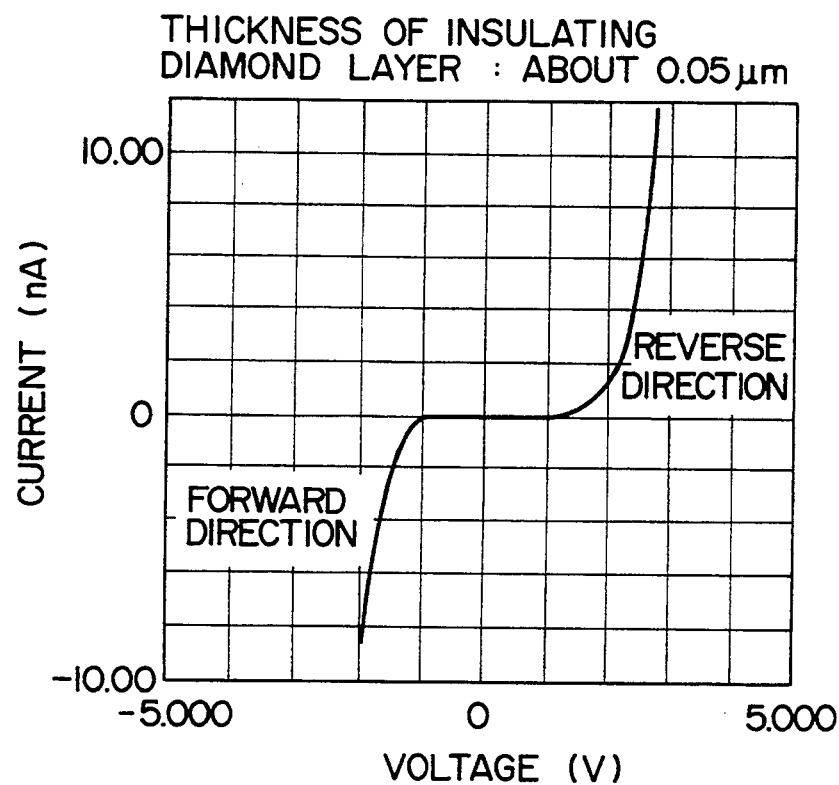
FIG. 3 is a graph showing the current-voltage characteristics of a diamond Schottky diode of the present invention.
Figure 4:
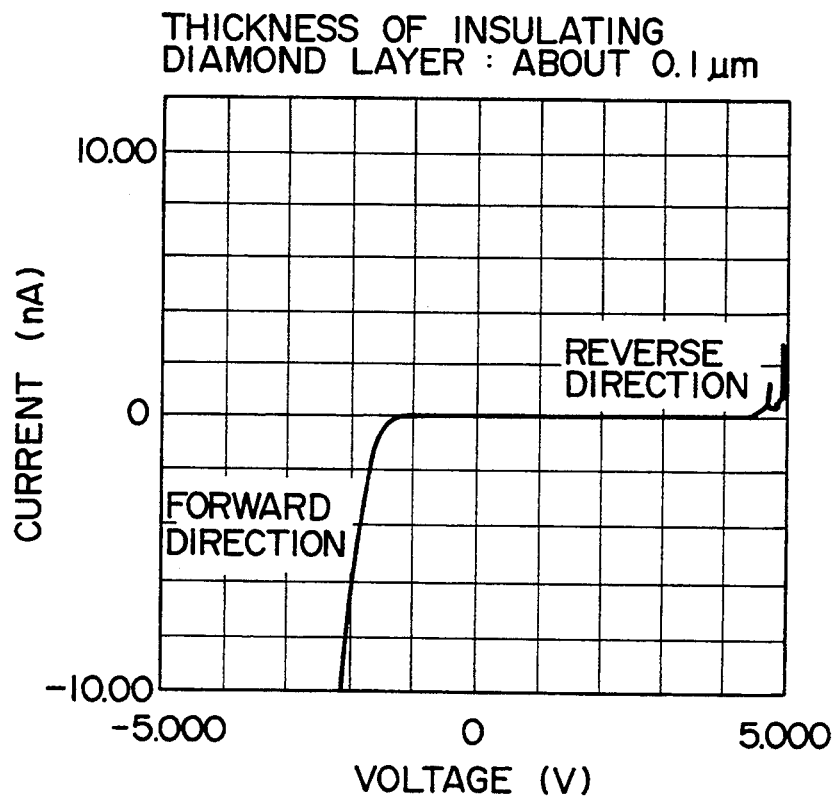
FIG. 4 is a graph showing the current-voltage characteristics of another diamond Schottky diode of the present invention.
Figure 5:
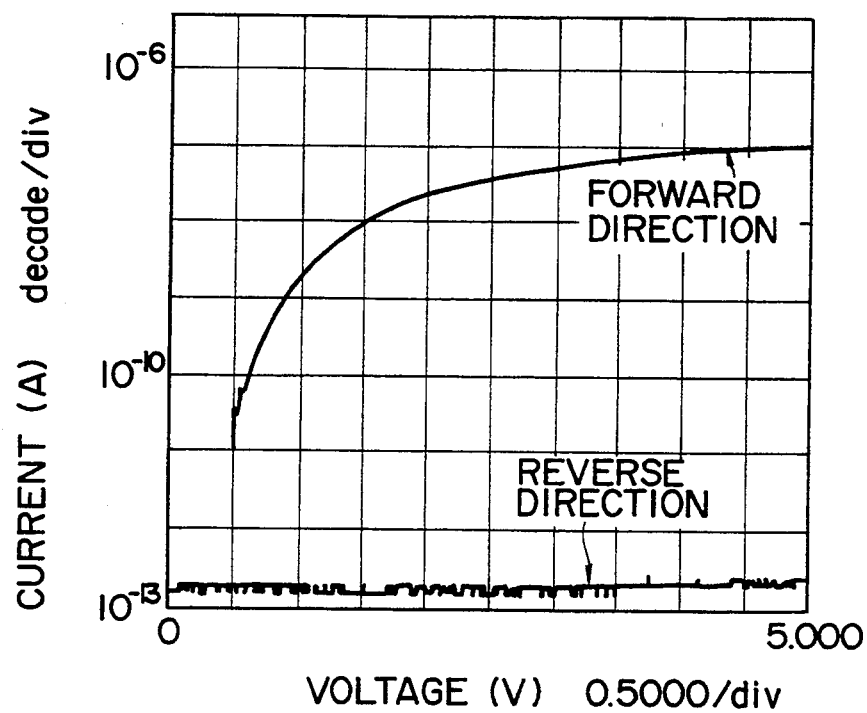
FIG. 5 is a graph showing the different representation of current-voltage characteristics as shown in FIG. 4, with current logarithmically plotted and voltage linearly plotted.
Figure 6:
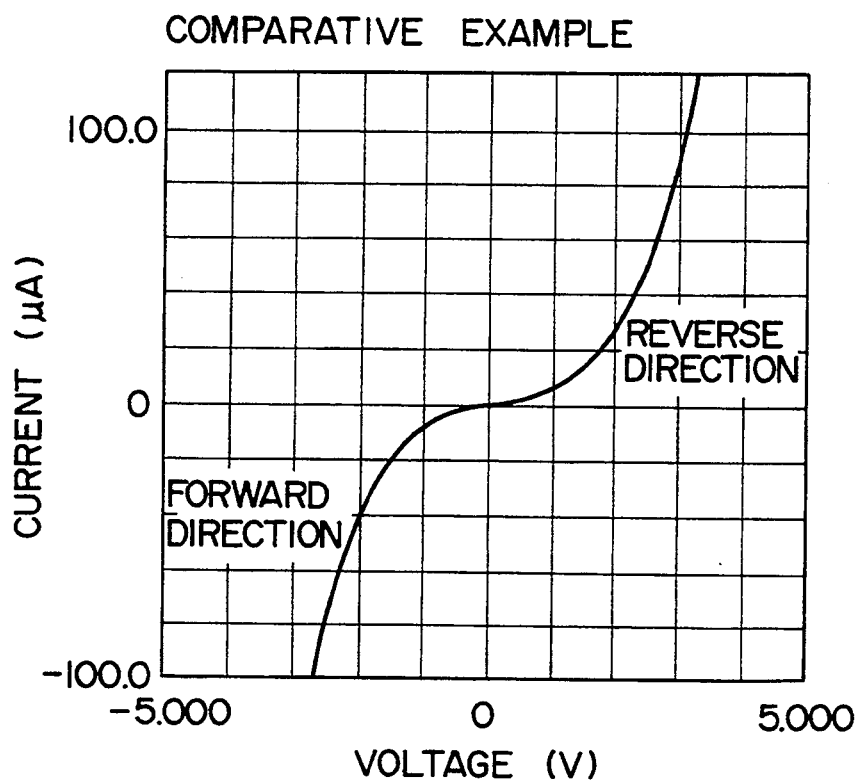
FIG. 6 is a graph showing the current-voltage characteristics of a reference diamond Schottky diode without an insulating diamond layer.

The diamond Schottky diodes thus obtained were tested for the current-voltage characteristics (I-V curve) at room temperature (about 24° C.) using a prober. The results are shown in FIGS. 3 to 6: FIG. 3 is an I-V curve of the sample having an insulating diamond layer of about 0.05 μm thick; FIG. 4 is an I-V curve of the sample having an insulating diamond layer of about 0.1 μm thick; FIG. 5 is the different representation of the I-V curve of FIG. 4, with current logarithmically plotted and voltage linearly plotted; and FIG. 6 is an I-V curve of the reference sample without an insulating diamond layer.

As is apparent from FIGS. 3 and 4, the diamond Schottky diode in these examples has improved rectifying characteristics with the reverse current greatly reduced in comparison with the reference sample shown in FIG. 6. Furthermore, the reverse current is reduced as the thickness of the insulating diamond layer 3 is increased. In this example, the minimum reverse current was achieved in the sample having the insulating diamond layer 3 of about 0.1 μm formed by the reaction for 60 min. The I-V curve shown in FIG. 4 is represented again in FIG. 5, with current logarithmically plotted and voltage linearly plotted. As seen in FIG. 5, the reverse current is too small to be measured by the I-V analyzer used. The reverse current density was estimated to be lower than $1.3 \times 10^{-9}$ A/cm$^2$ from the measurement range. The foregoing current voltage characteristics indicate that the diamond Schottky diode has holes as the majority carriers.

Theoretically, the diamond Schottky diode should adequately function if the insulating diamond layer 3 has a thickness several times as large as the de Broglie wavelength of the hole. In this example, the reverse current could be reduced in the sample having an insulating diamond layer 3 of about 0.1 μm thick formed by the reaction for 60 minutes. This suggests that the insulating diamond layer 3 is required for a certain thickness to be formed continuously on the polycrystalline p-type semiconducting diamond layer 2 having a comparatively rough surface.

Conversely, if the insulating diamond layer 3 is excessively thick, a large voltage drop will occur across it. Consequently, the voltage applied to the p-type semiconducting diamond layer 2 becomes too small to change the built-in potential thereof, so that the ideal current-voltage characteristics can be obtained. The permissible maximum thickness of the insulating diamond layer 3 is about 10 μm.

Incidentally, since the insulating diamond layer 3 is formed from a source gas of $CH_4$—$H_2$ mixture added with oxygen, it is superior in crystallinity to the B-doped semiconducting diamond layer 2. Therefore, it has less lattice defects on its surface which lowers level density at the interface between it and the Al electrode 4 thereby reducing the recombination current. This is another conceivable reason for the small reverse current.

In this example, aluminum was used for the metal electrode 4 formed on the insulating diamond layer 3. However, aluminum may be replaced by any other metal, because diamond is a strongly covalent substance, with its Fermi level firmly pinned, and hence the variation of metal affects only a little the potential barrier at the interface between the insulating diamond layer 3 and the metal electrode. However, if an electrode liable to form carbide is used, it is reacted with the insulating diamond layer 3 to form carbide at the interface thereof functioning as an ohmic electrode. Therefore, the metal less liable to form carbide, such as Al, Au or Pt, is preferable for the metal electrode formed on the insulating diamond layer.

Example 2

A diamond Schottky diode was fabricated, which has an n-type semiconducting diamond layer in place of the p-type semiconducting diamond layer 2.

A Si-doped polycrystalline n-type semiconducting diamond layer of about 2 μm thick was formed on a low-resistance silicon substrate by microwave plasma CVD. As a reaction gas, there was used a $CH_4$—$H_2$ mixture ($CH_4$ concentration: 0.5%) added with $SiH_4$ (silane) diluted with $H_2$ in a concentration of 0.5 ppm to the whole gas flow rate of 100 sccm. The reaction time used was 7 hours.

An insulating diamond layer of 0.1 μm thick is formed on the n-type semiconducting diamond layer 2 by microwave plasma CVD. The same reaction gas as in Example 1 was used, and the reaction time used was 60 minutes. An Al electrode having a diameter of about 100 μm was formed on the insulating diamond layer and an ohmic electrode made of copper plate was bonded to the back side of the silicon substrate with a silver paste, in the same manner as in Example 1.

The thus formed diamond Schottky diode having an n-type semiconducting diamond layer was tested for the current-voltage characteristics. It was found that the reverse current is extremely reduced in comparison with the n-type diamond Schottky diode without insulating diamond layer. In this case, the reverse current was too small to be measured by the I-V analyzer used, so that the reverse current density was estimated to be lower than $1 \times 10^{-9}$ $A/cm^2$ from the measurement range. Since this diamond Schottky diode has the n-type semiconducting diamond, a forward current is generated when a positive voltage is applied to the aluminum electrode.

As mentioned above, the present invention provides a diamond Schottky diode comprising an electrically conductive substrate, a multi-layer structure of a semiconducting diamond layer and an insulating diamond layer, and a metal electrode. With this structure, the diamond Schottky diode has a greater potential barrier under a reversed bias and hence exhibits better rectifying characteristics with a smaller reverse current.

What is claimed as new and desired to be secured by Letters Patent of the United States is:

1. A diamond Schottky diode formed by a process comprising the steps of:
   depositing a semiconducting diamond layer on a substrate;
   depositing an insulating diamond layer on the semiconducting diamond layer using a mixture of gases which include at least carbon atoms, hydrogen atoms, and oxygen atoms as constituent atoms, and the oxygen atom concentration is sufficiently high to ensure that said insulating diamond layer is more highly crystalline and has lowered lattice defects than an insulating diamond layer which is grown without oxygen;
   depositing an electrode on the insulating diamond layer.

2. The diamond Schottky diode according to claim 1, wherein the semiconducting diamond layer has a p-type conductivity.

3. The diamond Schottky diode according to claim 2, wherein the semiconducting diamond layer comprises a B-doped polycrystalline p-type semiconducting type.

4. The diamond Schottky diode according to claim 1, wherein the semiconducting diamond layer has an n-type conductivity.

5. The diamond Schottky diode according to claim 4, wherein the semiconducting diamond layer comprises an Si-doped polycrystalline n-type semiconductivity diamond layer.

* * * * *